(12) United States Patent
Abou-Kandil et al.

(10) Patent No.: US 10,230,015 B2
(45) Date of Patent: Mar. 12, 2019

(54) TEMPERATURE GRADING FOR BAND GAP ENGINEERING OF PHOTOVOLTAIC DEVICES

(71) Applicant: INTERNATIONAL BUSINESS MACHINES CORPORATION, Armonk, NY (US)

(72) Inventors: Ahmed Abou-Kandil, Elmsford, NY (US); Keith E. Fogel, Hopewell Junction, NY (US); Augustin J. Hong, White Plains, NY (US); Jeehwan Kim, Los Angeles, CA (US); Mohamed Saad, White Plains, NY (US); Devendra K. Sadana, Pleasantville, NY (US)

(73) Assignee: International Business Machines Corporation, Armonk, NY (US)

(*) Notice: Subject to any disclaimer, the term of this patent is extended or adjusted under 35 U.S.C. 154(b) by 196 days.

(21) Appl. No.: 14/697,250

(22) Filed: Apr. 27, 2015

(65) Prior Publication Data

US 2015/0228833 A1    Aug. 13, 2015

Related U.S. Application Data

(62) Division of application No. 13/295,511, filed on Nov. 14, 2011, now Pat. No. 9,040,340.

(51) Int. Cl.
*H01L 31/044* (2014.01)
*H01L 31/075* (2012.01)
(Continued)

(52) U.S. Cl.
CPC ...... *H01L 31/075* (2013.01); *H01L 27/14692* (2013.01); *H01L 31/0288* (2013.01);
(Continued)

(58) Field of Classification Search
CPC ........ H01L 31/00–31/078; Y02E 10/50–10/60
(Continued)

(56) References Cited

U.S. PATENT DOCUMENTS 4,547,621 A * 10/1985 Hack ............... H01L 31/065
                                                          136/249
4,816,082 A *  3/1989 Guha .............. H01L 31/065
                                                          136/249
(Continued)

OTHER PUBLICATIONS

Kim, W., et al. "Use of a Carbon-Alloyed Graded-Band-Gap Layer at the P/I Interface to Improve the Photocharacteristics of Amorphous Silicon Alloyed P-I-N Solar Cells Prepared by Photochemical Vapor Deposition" Journal of Applied Physics. Apr. 1987. pp. 3071-3076.
(Continued)

*Primary Examiner* — Bach T Dinh
(74) *Attorney, Agent, or Firm* — Tutunjian & Bitetto, P.C.; Erik Johnson

(57) ABSTRACT

A photovoltaic device includes a p-type layer. An intrinsic layer is formed directly on the p-type layer and includes an interface region extending into the intrinsic layer that includes a gradually decreasing band gap energy going from the p-type layer into the intrinsic layer formed by a graded deposition temperature. An n-type layer is formed directly on the intrinsic layer.

14 Claims, 3 Drawing Sheets

(51) Int. Cl.
*H01L 27/146* (2006.01)
*H01L 31/20* (2006.01)
*H01L 31/0224* (2006.01)
*H01L 31/0288* (2006.01)

(52) U.S. Cl.
CPC ........... *H01L 31/022466* (2013.01); *H01L 31/022475* (2013.01); *H01L 31/022483* (2013.01); *H01L 31/202* (2013.01); *Y02E 10/548* (2013.01); *Y02P 70/521* (2015.11)

(58) Field of Classification Search
USPC .................................................. 136/243–265
See application file for complete search history.

(56) References Cited

U.S. PATENT DOCUMENTS

| | | | | |
|---|---|---|---|---|
| 5,204,272 A | * | 4/1993 | Guha | C23C 16/511 136/258 |
| 5,429,685 A | * | 7/1995 | Saito | H01L 31/03921 136/255 |
| 5,646,050 A | * | 7/1997 | Li | H01L 31/03767 136/258 |
| 2003/0230233 A1 | * | 12/2003 | Fitzgerald | C23C 16/029 117/89 |
| 2007/0264801 A1 | * | 11/2007 | Cody | C23C 16/22 438/478 |
| 2010/0062561 A1 | * | 3/2010 | Roca I Cabarrocas | C23C 16/24 438/96 |
| 2010/0071745 A1 | * | 3/2010 | Lee | H01L 31/075 136/244 |

OTHER PUBLICATIONS

Tran, N., et al. "Effects of Carbon Profiles at the P/I Interface Amorphous Silicon Solar Cells" Physics Status Solidi (a), vol. 99, Issue 2. Dec. 1987. pp. 143-148.

* cited by examiner

TEMPERATURE GRADING FOR BAND GAP ENGINEERING OF PHOTOVOLTAIC DEVICES

RELATED APPLICATION INFORMATION

This application is a Divisional application of copending U.S. patent application Ser. No. 13/295,511, filed on Nov. 14, 2011, which is incorporated herein by reference in its entirety.

BACKGROUND

Technical Field

The present invention relates to photovoltaic devices and methods, and more particularly to devices and fabrication methods employing deposition temperature grading.

Description of the Related Art

Solar cells employ photovoltaic cells to generate current flow. Photons in sunlight hit a solar cell or panel and are absorbed by semiconducting materials, such as silicon. Carriers gain energy allowing them to flow through the material to produce electricity. When a photon hits a piece of silicon, the photon may be transmitted through the silicon, the photon can reflect off the surface, or the photon can be absorbed by the silicon, if the photon energy is higher than the silicon band gap value. This generates an electron-hole pair and sometimes heat, depending on the band structure.

When a photon is absorbed, its energy is given to a carrier in semiconductors. Electrons in the valence band may be excited into the conduction band, where they are free to move within the semiconductor. The bond that the electron(s) were a part of form a hole. These holes can move through the semiconductor creating mobile electron-hole pairs.

A photon need only have greater energy than that of a band gap to excite an electron from the valence band into the conduction band. Since solar radiation is composed of photons with energies greater than the band gap of silicon, the higher energy photons will be absorbed by the solar cell, with some of the energy (above the band gap) being turned into heat rather than into usable electrical energy.

A solar cell may be described in terms of a fill factor (FF). FF is a ratio of the maximum power point ($P_m$) divided by open circuit voltage ($V_{oc}$) and short circuit current ($J_{sc}$):

$$FF = \frac{P_m}{V_{oc}J_{sc}}.$$

The fill factor is directly affected by the values of a cell's series and shunt resistance. Increasing the shunt resistance ($R_{sh}$) and decreasing the series resistance (Rs) will lead to a higher fill factor, thus resulting in greater efficiency, and pushing the cells output power closer towards its theoretical maximum.

Light induced degradation occurs in an amorphous semiconductor structure when the structure becomes saturated by incoming radiation (light soaked). The structure begins to degrade due in part to the reconfiguration of hydrogen atoms, which results in passivation loss and bond breaking between constituent materials. This degradation process becomes prominent if there exists a band offset at a p-i interface and/or at a transparent conductive oxide (TCO) to p+ interface. The Staebler-Wronski effect (SW effect) also affects solar devices and needs to be minimized.

SUMMARY

A photovoltaic device includes a p-type layer. An intrinsic layer is formed directly on the p-type layer and includes an interface region extending into the intrinsic layer that includes a gradually decreasing band gap energy going from the p-type layer into the intrinsic layer formed by a graded deposition temperature. An n-type layer is formed directly on the intrinsic layer.

A photovoltaic device includes a p-type layer. An electrode is formed in contact with the p-type layer. An intrinsic layer is formed directly on the p-type layer and includes an interface region extending into the intrinsic layer that includes a gradually decreasing band gap energy going from the p-type layer into the intrinsic layer formed by a graded deposition temperature. The interface region includes a band gap alignment region that is free of discontinuous barriers, such that band gap energy includes a continuous transition between the p-type layer and the intrinsic layer. An n-type layer is formed directly on the intrinsic layer.

A photovoltaic device includes a p-type layer formed from amorphous silicon. An electrode is formed in contact with the p-type layer. An intrinsic layer is formed from amorphous silicon formed directly on the p-type layer and has an interface region extending into the intrinsic layer that includes a gradually decreasing band gap energy going from the p-type layer into the intrinsic layer formed by a graded deposition temperature. The interface region includes a band gap alignment region that is free of discontinuous barriers, such that band gap energy includes a continuous, linear decrease between the p-type layer and the intrinsic layer. An n-type layer formed with amorphous silicon is formed directly on the intrinsic layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
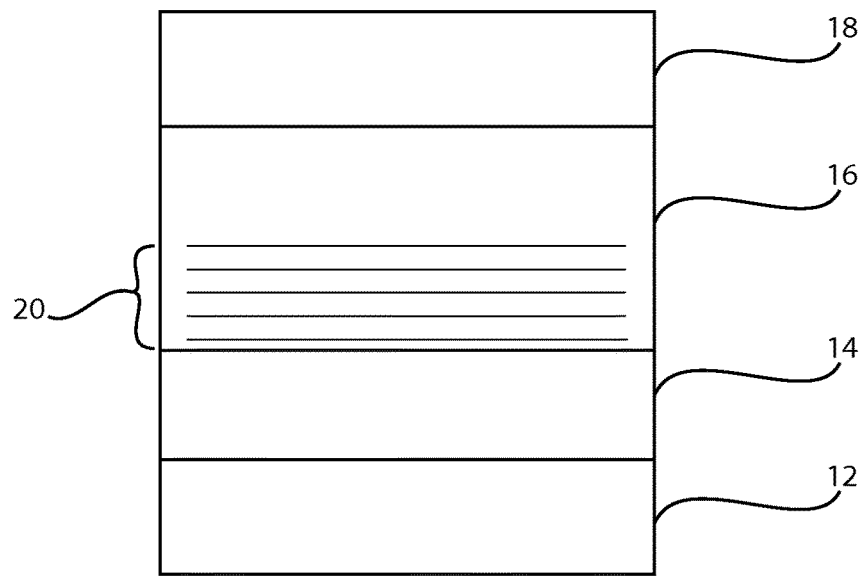
FIG. 1 is a cross-sectional view of a device, such as a photovoltaic device, formed in accordance with the present principles.

In accordance with the present principles, methods and devices are provided that employ a graded deposition temperature formation of device layers for photovoltaic devices. Photovoltaic devices, and in particular amorphous silicon photovoltaic devices, include an intrinsic layer (i-layer) with an interface (p-i interface) to a doped layer (in particular, a p-layer although an n-layer may also benefit). Band offset at the p-i interface cannot be avoided since high band gap materials are required for the p+ layer to provide high open circuit voltage, while low band gap materials are desirable for the intrinsic layer to utilize more of the photon spectrum. Band offset at a conductive electrode (e.g., a transparent conductive oxide (TCO)) and the p+ layer is also unavoidable since all developed TCO films are n-type. There exists an offset amount between an increased initial efficiency and a reduced light induced degradation that could be achieved.

In particularly useful embodiments, photovoltaic devices are constructed using processes that reduce the risk of light-induced degradation. In one example, a device is provided which has a minimized band offset at a p-doped layer to intrinsic layer (p-i) interface by forming the interface with a gradually changing deposition temperature.

Conventional hydrogenated amorphous silicon (a-Si:H) solar cell structures include a p-i-n stack with high band gap p+a-SiC:H/intrinsic a-Si:H/n+a-Si:H layers. To attempt to minimize band offset at the p-i interface (e.g., the p-i barrier), carbon grading has been employed, which resulted in higher open circuit voltage. However, including carbon in a-Si:H solar cell accelerated light-induced degradation so that incorporation of carbon in the i-layer was highly undesirable. The present principles have employed the use of temperature for band gap engineering, which provides more desirable results since the band gap of a-Si:H sensitively changes as a function of temperature.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case the devices/chips is then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

The present embodiments may be part of a photovoltaic device or circuit, and the circuits as described herein may be part of a design for an integrated circuit chip, a solar cell, a light sensitive device, etc.

Referring now to the drawings in which like numerals represent the same or similar elements and initially to FIG. 1, a band offset is adjusted in accordance with the present principles to provide a degradation-resistant photovoltaic device 10. As described, the process and/or the carrier concentration may be adjusted by deposition temperature gradation. In one embodiment, an electrode layer 12 may be formed. The electrode layer 12 may include a transparent conductive oxide (TCO), such as zinc oxide, indium tin oxide, indium zinc oxide, etc. The device 10 includes a p-type layer 14, which may include, amorphous (hydrogenated) silicon (e.g., a-Si:H) or amorphous (hydrogenated) SiC (a-SiC:H) doped with B or the like. An intrinsic layer 16 is formed on the p-type layer 14. The intrinsic layer 16 may preferably be undoped a-Si although other materials may be employed. An n-type layer 18 is formed on the intrinsic layer 16, and may also include a-Si doped with P or the like. In accordance with the present principles, the device 10 includes a deposition process where an interface region 20 is formed through the intrinsic layer 16 which is formed by depositing the respective materials while increasing the deposition temperature. The p-type layer 14 is deposited at low temperature as a window layer to enhance Voc of the device 10. The p-type layer 14 may be deposited at a temperature of about 200 degrees C. and include a-Si:H. Then, temperature grading begins with the intrinsic layer 16 deposition.

As an alternative, the p layer 14 may include p+a-SiC:H and may be deposited at a temperature of, e.g., about 250 degrees C. (this preferably has an equivalent $E_g$ as would be obtained by the 200 degrees C. a-Si:H deposition) and then temperature is reduced back to about 200 degrees C. for the start of i-layer deposition. The i-layer deposition temperature is gradually increased with i-layer thickness. In one illustrative example, the p-type layer 14 includes a-Si doped with B. The p-type layer 14 begins to be formed using a chemical vapor deposition process (CVD) or the like having a deposition temperature of about 200 degrees C. As deposition continues, the temperature of deposition is gradually increased reaching about 250 degrees C. within the intrinsic layer 16. During the process, the dopant source is removed to end the p-type layer 14. It should be understood that the temperatures need not be 200 or 250 degrees C., as these temperature are illustrative of desirable low deposition temperatures. Although low temperatures are preferred, other temperatures may be employed. One guiding principle preferably includes a 50 to 80 degree C. difference between the p-type layer 14 deposition temperature and an end deposition temperature of the i-layer 16.

Figure 2:
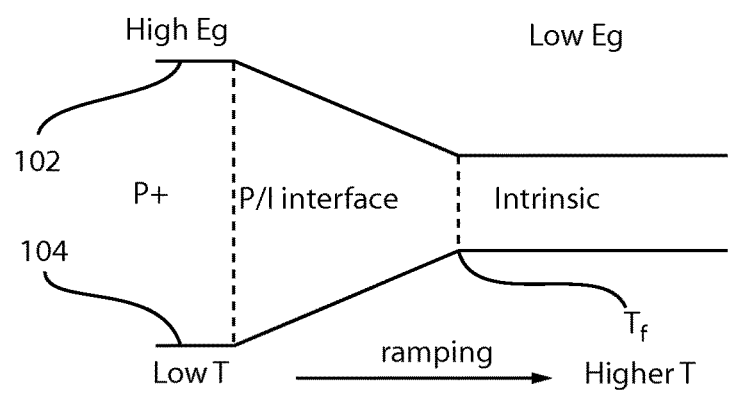
FIG. 2 is a diagram showing a relationship between band gap energy and temperature gradation across a photovoltaic stack in accordance with the present principles.
Figure 2:
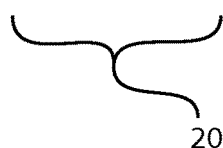

Referring to FIG. 2 with continued reference to FIG. 1, a diagram shows an illustrative relationship between band gap ($E_g$) and temperature (T). A curve 102 shows band gap changes through the interface region 20. At a bottom of p-type layer 14, $E_g$ is highest. As the i-type layer 16 is being formed temperature T shown on curve 104 begins to increase and the band gap, $E_g$, begins to decrease. As the end of the transition region 20 is reached, the temperature is fixed at a final temperature ($T_f$) where the bulk material of the intrinsic layer 16 maintains a lower band gap energy. The gradual temperature increase provides a more gradual band gap energy transition. No additional materials such as carbon need to be employed to provide superior degradation resistance to light induced degradation. It should be understood that the temperature change may be graded or graduated to provide a profile that may be linear, exponential, stepped, etc.

Figure 3:
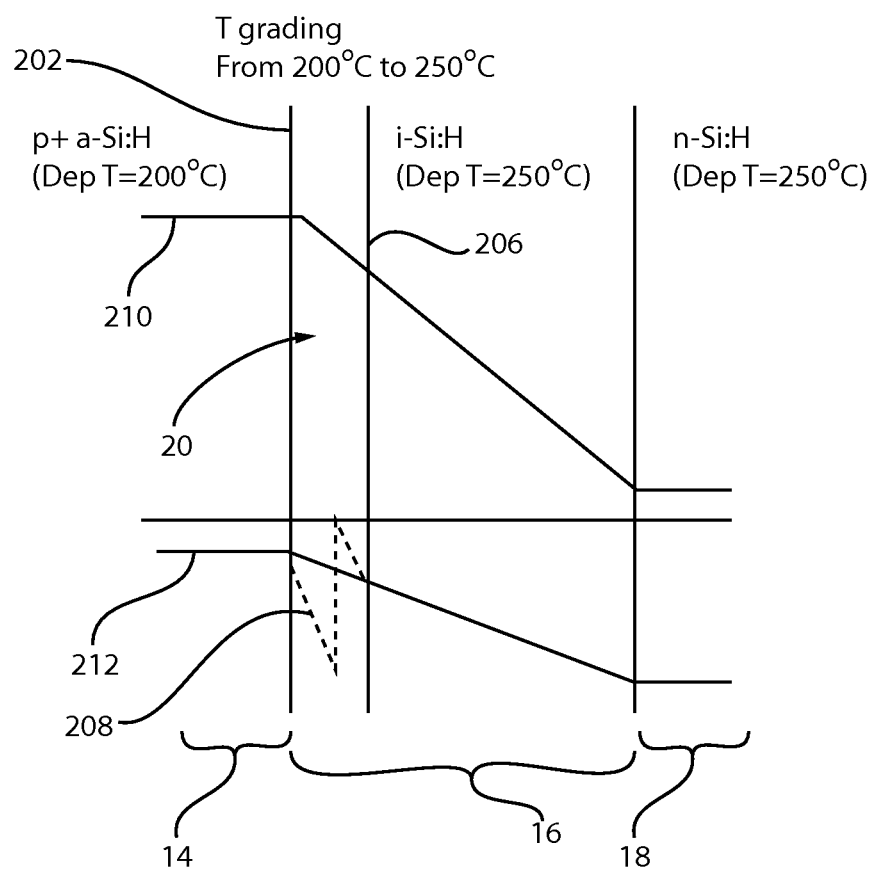
FIG. 3 is a diagram showing continuous, barrier-removed band alignment due to temperature gradation across a photovoltaic stack in accordance with the present principles.

Referring to FIG. 3, an illustrative example shows band alignment with temperature grading for device 10 (FIG. 1). FIG. 3 shows band alignment between the different materials of device 10. Band energy in p-type layer 14 is deposited at a constant temperature (e.g., 200 degrees C.) until the interface region 20 is reached and boundary 202. Then, temperature grading of the deposition temperature is performed as described above through the interface region 20. In one embodiment, a dopant source may be stopped at boundary line 202, which marks the boundary between the p-type layer 14 and the intrinsic layer 16. Temperature grading in interface region 20 continues beyond boundary line 202 into the intrinsic layer 16 stopping at boundary line 206. In this example, the temperature is ramped up to 250 degrees C. in the interface region 20 and is maintained at that temperature into intrinsic layer 16 and through n-type layer 18.

As a result, a band 210 for holes is in alignment between the p-type layer 14 into the intrinsic layer 16. Likewise, a band 212 for electrons is in alignment between the p-type layer 14 into the intrinsic layer 16. The smoother transition of the band 212 reduces light trapping and light-induced degradation. The smoother transition of the band 212 is in contradiction of a conventional approach of employing carbon or other material dopants in the interface region 20. While the carbon aids in aligning the bands, a barrier 208 is formed at the interface (204) between materials (14 and 16). This barrier 208 is responsible for increased degradation due to light-induced mechanisms. In accordance with the present principles, the barrier 208 is removed (no carbon is employed) and the band alignment is achieved through temperature grading.

TABLE I shows three different fabrication methods for comparison. Case 1 is "no offset" where a constant temperature of 250 degrees C. is employed to form the p-type layer, the intrinsic layer and the n-type layer. Case 2 includes employing a 200 degrees C. temperature for forming the p-type layer followed by a 250 degrees C. deposition of the intrinsic layer (no temperature grading). Case 3 includes employing a 200 degrees C. temperature for initially forming the p-type layer followed by a temperature grading deposition up to 250 degrees C. in the intrinsic layer in accordance with the present principles. As can be seen in TABLE I, the degradation efficiency remains approximately the same between cases 2 and 3 (the higher the degradation efficiency the more degradation). Case 3 has bands aligned (see FIG. 3) while case 2 does not. Case 3 aligns the bands without the injection of carbon. In fact, using only 2% carbon to assist in band alignment results in a 12% degradation efficiency which is significantly more degradation then Case 3 . For case 3 , the stable efficiency and open circuit voltage (Voc) are also increased over the other cases, and fill factor (FF) is maintained/enhanced as well with a reduction in light-induced degradation.

TABLE I

| P-type layer | Efficiency Degradation (%) | Stable Efficiency (%) | FF | Voc | Jsc |
| --- | --- | --- | --- | --- | --- |
| Case 1: No Offset | 3.5 | 7.09 | 65 | 780 | 14.03 |
| Case 2: 200 C.(p)/250(i) | 3.9 | 7.34 | 63 | 813 | 14.29 |
| Case 3: 200 C.(p) → 250 C.(i) (grading) | 4.0 | 7.73 | 65 | 845 | 14.09 |

Figure 4:
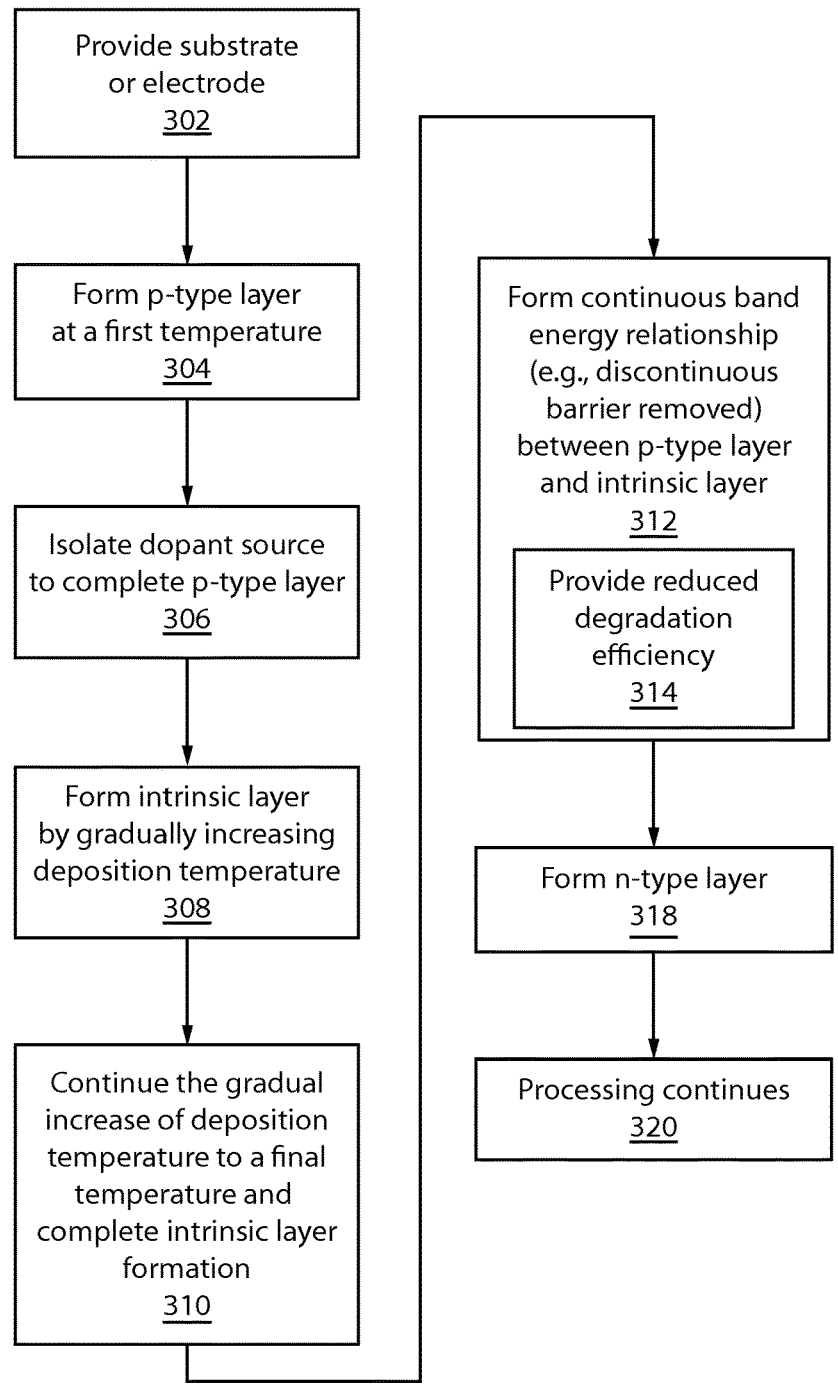
FIG. 4 is a block/flow diagram showing a method for fabricating a photovoltaic device in accordance with one illustrative embodiment.

Referring to FIG. 4, a method for fabricating a photovoltaic device is shown in accordance with one illustrative embodiment. In block 302, a substrate or electrode is formed or provided. The substrate or electrode provides a platform on which to form active stack layers for a device. The electrode or substrate includes features or materials consistent with the application of the device. In one embodiment, the electrode includes a transparent conductive electrode or a metal electrode. In block 304, a p-type layer is formed at a first temperature on the electrode. In block 306, the p-type layer may be completed by isolating a dopant source or other steps to transition to an intrinsic layer. In block 308, an intrinsic layer is formed on the p-type layer. As the intrinsic layer is being formed, a deposition temperature is gradually increased. The gradual increase of the deposition temperature may include a linear increase, a stepped increase, an exponential increase or other temperature profile. The p-type layer is preferably formed at constant but lower temperature than a final intrinsic layer deposition temperature. In block 310, the gradually increase to the deposition temperature continues to a final temperature which is employed to complete the formation of the intrinsic layer.

In block 312, the gradually increase of deposition temperature forms a band gap alignment region between the p-type layer and the intrinsic layer such that band gap energy includes a gradual or continuous transition between into the intrinsic layer. The band gap alignment region is free of discontinuous barriers between and in the p-type layer and the intrinsic layer. In block 314, degradation efficiency is provided that is less than degradation efficiency provided by including carbon at an interface between the p-type layer and the intrinsic layer.

In block 318, an n-type layer is formed on the intrinsic layer. In block 320, processing continues, which may include the formation of another electrode or other structures or layers including additional stacks for additional photovoltaic cells (e.g., tandem cells).

It should be understood that while the p-type layer, the intrinsic layer and the n-type layer may include amorphous silicon, other materials may also be employed and benefit from band gap engineering in accordance with the present principles. With amorphous silicon based technology, useful temperatures include about 200 degrees Celsius for the first temperature and about 250 degrees Celsius for the final temperature. Other temperatures and temperature differentials may also be employed.

Having described preferred embodiments of a temperature grading for band gap engineering of photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
a p-type layer;
an intrinsic semiconductor layer formed directly on the p-type layer without the addition of any additives, comprising an interface region extending only part-way into the intrinsic layer, formed directly between two regions of constant band gap energy, that includes a monotonically decreasing band gap energy going from the p-type layer into the intrinsic layer formed by a graded deposition temperature, wherein the graded deposition temperature is graded according to an exponential profile that determines a deposition temperature at every point in the interface region; and
an n-type layer formed directly on the intrinsic layer.

2. The device as recited in claim 1, wherein the p-type layer, the intrinsic layer and the n-type layer include amorphous silicon or an amorphous compound including silicon.

3. The device as recited in claim 1, wherein the interface region is formed by grading a deposition temperature from about 200 degrees Celsius to about 250 degrees Celsius.

4. The device as recited in claim 1, wherein the interface region includes a band gap alignment region between the p-type layer and the intrinsic layer such that band gap energy includes a gradual transition between the p-type layer and the intrinsic layer.

5. The device as recited in claim 4, wherein the band gap alignment region is free of discontinuous barriers between the p-type layer and the intrinsic layer.

6. The device as recited in claim 1, further comprising a degradation efficiency that is less than a degradation efficiency provided by including carbon at an interface between the p-type layer and the intrinsic layer.

7. The device as recited in claim 1, further comprising at least one electrode formed in contact with the p-type layer.

8. A photovoltaic device, comprising:
a p-type layer;
an electrode formed in contact with the p-type layer;
an intrinsic amorphous hydrogenated silicon layer formed directly on the p-type layer without the addition of any additives, comprising an interface region extending only part-way into the intrinsic layer, formed directly between two regions of constant band gap energy, that includes a monotonically decreasing band gap energy going from the p-type layer into the intrinsic layer formed by a graded deposition temperature, wherein the interface region includes a band gap alignment region that is free of discontinuous barriers, such that band gap energy includes a continuous transition between the p-type layer and the intrinsic layer and wherein the graded deposition temperature is graded according to an exponential profile that determines a deposition temperature at every point in the interface region; and
an n-type layer formed directly on the intrinsic layer.

9. The device as recited in claim 8, wherein the p-type layer, the intrinsic layer and the n-type layer include amorphous silicon or an amorphous compound including silicon.

10. The device as recited in claim 8, wherein the interface region is formed by grading a deposition temperature from about 200 degrees Celsius to about 250 degrees Celsius.

11. The device as recited in claim 8, further comprising a degradation efficiency that is less than a degradation efficiency provided by including carbon at an interface between the p-type layer and the intrinsic layer.

12. A photovoltaic device, comprising:
a p-type layer comprising amorphous silicon;
an electrode formed in contact with the p-type layer;
an intrinsic layer comprising amorphous silicon formed directly on the p-type layer, comprising an interface region extending only part-way into the intrinsic layer, formed directly between two regions of constant band gap energy, that includes a monotonically decreasing band gap energy going from the p-type layer into the intrinsic layer formed by a graded deposition temperature with adding additional materials to the amorphous silicon, wherein the interface region includes a band gap alignment region that is free of discontinuous barriers, and wherein the graded deposition temperature is graded according to an exponential profile; and
an n-type layer comprising amorphous silicon formed directly on the intrinsic layer.

13. The device as recited in claim 12, wherein the interface region is formed by grading a deposition temperature from about 200 degrees Celsius to about 250 degrees Celsius.

14. The device as recited in claim 12, further comprising a degradation efficiency that is less than a degradation efficiency provided by including carbon at an interface between the p-type layer and the intrinsic layer.

* * * * *